US006737713B2

(12) United States Patent
Georgescu et al.

(10) Patent No.: US 6,737,713 B2
(45) Date of Patent: May 18, 2004

(54) SUBSTRATE CONNECTION IN AN INTEGRATED POWER CIRCUIT

(75) Inventors: Sorin Stefan Georgescu, San Jose, CA (US); Carl Sawtell, San Jose, CA (US)

(73) Assignee: Tripath Technology, Inc., San Jose, CA (US)

( * ) Notice: Subject to any disclaimer, the term of this patent is extended or adjusted under 35 U.S.C. 154(b) by 0 days.

(21) Appl. No.: 10/189,284

(22) Filed: Jul. 2, 2002

(65) Prior Publication Data

US 2003/0085442 A1 May 8, 2003

Related U.S. Application Data

(60) Provisional application No. 60/302,773, filed on Jul. 3, 2001.

(51) Int. Cl.[7] ............................................. H01L 29/94
(52) U.S. Cl. ....................................... 257/394; 257/368
(58) Field of Search ................... 257/369, 370, 257/371, 372, 373, 368, 394

(56) References Cited

U.S. PATENT DOCUMENTS

| 3,649,887 | A |   | 3/1972  | Keller et al. ............ 317/235 R |
|-----------|---|---|---------|--------------------------------|
| 3,931,634 | A |   | 1/1976  | Knight ..................... 357/48 |
| 4,027,325 | A |   | 5/1977  | Genesi ..................... 357/48 |
| 4,466,011 | A |   | 8/1984  | Van Zanten ................ 357/48 |
| 4,811,065 | A | * | 3/1989  | Cogan |
| 4,890,149 | A |   | 12/1989 | Bertotti et al. ............ 357/48 |
| 4,960,723 | A | * | 10/1990 | Davies |
| 5,021,860 | A |   | 6/1991  | Bertotti et al. ............ 357/48 |
| 5,243,214 | A |   | 9/1993  | Sin et al. ................ 257/372 |
| 5,495,123 | A |   | 2/1996  | Canclini .................. 257/500 |
| 5,514,901 | A |   | 5/1996  | Peppiette et al. ........... 257/547 |
| 5,545,917 | A |   | 8/1996  | Peppiette et al. ........... 257/547 |
| 5,777,512 | A |   | 7/1998  | Tripathi et al. ............ 330/207 |
| 5,834,826 | A |   | 11/1998 | Menegoli .................. 257/546 |
| 5,907,163 | A | * | 5/1999  | Skebe et al. |
| 6,160,304 | A |   | 12/2000 | Ludikhuize ................ 257/549 |
| 6,248,616 | B1 |  | 6/2001  | Ravanelli et al. .......... 438/138 |
| 6,288,424 | B1 |  | 9/2001  | Ludikhuize ................ 257/335 |
| 6,395,593 | B1 |  | 5/2002  | Pendharkar et al. ........ 438/207 |

OTHER PUBLICATIONS

Robert J. Widlar, "Controlling Substrate Currents in Junction–Isolated IC's", IEEE Journal of Solid–State Circuits, vol. 26, No. 8, Aug. 1991, pp. 1090–1097.
Murari, Bertotti, "BCD Technology for Smart Power ICs", Vignola (Eds.) Smart Power ICs, (1995, Springer), p. 49.
Murari, Bertotti, "Power Mosfets driving circuits and protection techniques", Vignola (Eds.) Smart Power ICs, (1995, Springer), p. 223.

* cited by examiner

Primary Examiner—Nathan J. Flynn
Assistant Examiner—Kevin Quinto
(74) Attorney, Agent, or Firm—Beyer Weaver & Thomas, LLP

(57) ABSTRACT

An integrated circuit is described having a substrate, a power transistor in a first region of the subtracted, and a plurality of barrier regions of the substrate around the first region. Each barrier region includes a barrier transistor and at least one substrate connection connecting the barrier transistor to at least one floating region of the substrate adjacent the barrier region. During operation of the integrated circuit, the floating regions and the barrier transistors operate to inhibit operation of parasitic devices associated with the power transistor 41 Claims, 2 Drawing Sheets

SUBSTRATE CONNECTION IN AN INTEGRATED POWER CIRCUIT

RELATED APPLICATION DATA

The present application claims priority from U.S. Provisional Patent Application No. 60/302,773 for SUBSTRATE CONNECTION IN AN INTEGRATED POWER CIRCUIT filed on Jul. 3, 2001, the entire disclosure of which is incorporated herein by reference for all purposes.

BACKGROUND OF THE INVENTION

The present invention relates to integrated circuit technology and, in particular, to techniques for dealing with the injection of carriers into an integrated circuit substrate due to the operation of parasitic devices.

Designers of integrated circuits are familiar with the problems associated with signal levels which go outside the range of supply voltages. These issues are particularly relevant to devices which include power transistors intended to drive inductive loads. For example, in devices having N-type diffusions in a P-type substrate, whenever a signal, e.g., an output signal connected to an N-type diffusion, goes sufficiently below the most negative supply associated with the device, the PN junction associated with the diffusion begins to conduct, resulting in the injection of minority carriers, i.e., electrons, into the substrate.

This is undesirable in that the PN junction of one diffusion may form part of a parasitic transistor with the PN junction of any other N-type diffusion in the device. That is, any other; N-type diffusion can become the collector of a parasitic NPN transistor. When this occurs, the carrier injection caused by the first diffusion results in current being drawn through the parasitic transistor from circuitry in the second diffusion. This can result in the enabling of circuitry associated with the second diffusion at undesirable times. It can also rob current from the circuitry associated with the other diffusions. In situations where the first diffusion is a power transistor with operating current measured in amps, the second diffusion includes control circuitry with operating current measured in microamps, and the beta of the parasitic device is high, the problem is clear.

On the other hand, if the signal exceeds the most positive power supply, a parasitic PNP transistor with the substrate as the collector may be formed resulting in the injection of majority carriers, i.e., holes, into the substrate. Due to the inherent resistivity of semiconductor substrates, this local injection of current tends to raise the local potential of the substrate which may result in the well known and destructive thyristor latch up mechanism.

It is therefore desirable to provide techniques and mechanisms by which the issues associated with the undesirable injection of carriers into integrated circuit substrates are avoided.

SUMMARY OF THE INVENTION

According to the present invention, the injection of minority carriers into an integrated circuit substrate is inhibited by allowing local regions of the substrate near certain devices to float rather than having them tied to a fixed potential. According to a more specific embodiment, barrier regions are provided between different portions of a monolithic integrated circuit, e.g., between two power devices, or between a power device and drive circuitry. These barrier regions include a barrier transistor which is connected to local regions of the substrate around the barrier region which are allowed to float within certain bounds, i.e., are not connected to a fixed potential. The local floating regions of the substrate and the barrier transistors operate to inhibit the operation of parasitic devices associated with the power device(s).

According to a particular embodiment, the invention provides an integrated circuit having a substrate, a power transistor in a first region of the substrate, and a plurality of barrier regions of the substrate around the first region. Each barrier region includes a barrier transistor and at least one substrate connection connecting the barrier transistor to at least one floating region of the substrate adjacent the barrier region. During operation of the integrated circuit, the floating regions and the barrier transistors operate to inhibit operation of parasitic devices associated with the power transistor.

According to a more specific embodiment, the invention provides an integrated circuit having a substrate, a high-side power transistor in a first region of the substrate, a low-side power transistor in a second region of the substrate, and a plurality of barrier regions of the substrate adjacent and separating the first and second regions. Each barrier region includes a barrier transistor and at least one substrate connection connecting the barrier transistor to at least one floating region of the substrate adjacent the barrier region. During operation of the integrated circuit, the floating regions and the barrier transistors operate to inhibit operation of parasitic devices associated with the high-side and low-side power transistors.

According to yet another embodiment, the present invention provides an integrated circuit having a substrate, a power transistor in a first region of the substrate which is isolated from the substrate by a PN junction, and a locally floating region of the substrate adjacent the first region. During operation of the integrated circuit, the potential of the locally floating region inhibits injection of minority carriers into the substrate due to forward biasing of the PN junction.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, miodifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known process operations have not been described in detail in order not to unnecessarily obscure the present invention.

Figure 1:
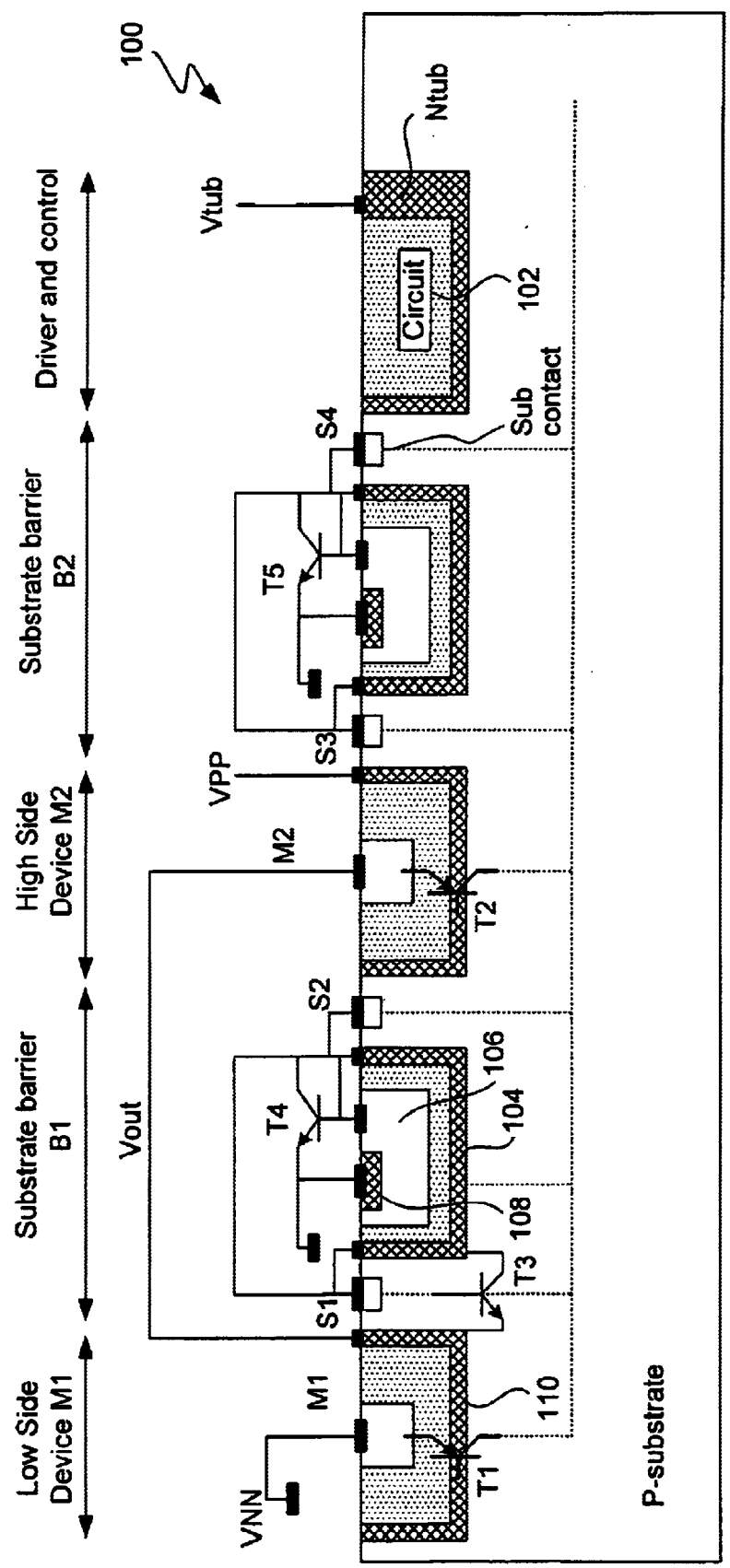
FIG. 1 is a cross-sectional diagram of a power integrated circuit illustrating an exemplary embodiment of the present invention.

FIG. 1 is a cross-sectional diagram of an exemplary power integrated circuit designed according to a specific embodiment of the present invention. It will be understood that the specific circuit configuration and the number and nature of device types and regions shown are exemplary and should not be used to limit the scope of the invention. That is, the principles of the present invention may be applied to provide isolation and mitigate effects associated with carrier injection in a wide variety of circuits and topologies. For example, the barrier regions of the present invention may be used with single or multiple power transistor configurations (including half-bridge and full-bridge configurations), or to provide barriers between any other types of circuitry in a monolithic device. In addition, as discussed above, because the nature of the parasitic devices which result in carrier injection issues may vary greatly, the specific parasitic devices discussed herein should not be used to limit the scope of the invention. In addition, it will be understood that the scale of the devices shown may not reflect the relative sizes of the corresponding regions in an actual device, e.g., barrier regions and transistors are likely to be considerably smaller than power transistor regions.

Referring now to FIG. 1, a cross section of an integrated circuit 100 is shown having a P-type substrate in which a variety of devices are implemented as N-type epi tubs. These devices include a low-side transistor M1 and a high-side transistor M2 connected in a half-bridge configuration between power supplies VPP and VNN and having an output Vout. In this example, M1 and M2 are assumed to be N-channel DMOS devices. However, it will be understood that the present invention may be applied to mitigate the effects of parasitic devices associated with a wide variety of transistors. Examples of parasitic transistors associated with transistors M1 and M2 are PNP transistors T1 and T2, respectively, which have the substrate as their collectors. According to a specific embodiment of the invention, the portion of integrated circuit 100 shown is a driver circuit for an inductive load. According to a more specific embodiment, the half-bridge configuration is the power stage for a digital switching amplifier. According to even more specific embodiments, the digital switching amplifier is an oversampled, noise-shaping, mixed-signal processor as described in U.S. Pat. No. 5,777,512, the entire disclosure of which is incorporated herein by reference for all purposes.

Substrate barrier regions B1 and B2 isolate M1 and M2 from each other as well as additional circuitry 102 which, in the embodiment shown, comprises driver and control circuitry for controlling the operation of the half-bridge. According to various embodiment, this circuitry may comprise a wide variety of circuitry including, for example, input/output circuitry. It will also be understood that regions B1 and B2 may represent many such regions formed around power devices M1 and M2. For example, according to various embodiments, hundreds of such regions may be formed around one device. According to a specific embodiment, low-side transistor M1 is positioned near the edge of the die to further isolate the device and thereby reduce the risk of interaction with other N-type diffusions on the die.

Each of the barrier regions B1 and B2 includes a vertical NPN transistor (T4 and T5, respectively), the collector and base of which is connected to adjacent regions of the substrate (S1 and S2 for T4; S3 and S4 for T5). According to a specific embodiment, the collectors of transistors T4 and T5 are the epi tubs 104, the bases are P regions 106 in the epi tubs, and the emitters are N+ regions 108 within the bases. As shown, the emitter of T4 is connected to the most negative power supply rail VNN.

According to various embodiments, the connections to regions S1–S4 are the only electrical connections to the substrate in the region around the devices shown. That is, local regions S1–S4 adjacent the barrier regions are not connected to a fixed potential, i.e., they are allowed to float within certain bounds as will become clear with reference to the subsequent discussion. According to a specific embodiment, regions S1–S4 comprise P+ diffusions.

A lateral parasitic NPN transistor T3 is shown between M1 and the collector of T4 with the local region of the substrate near region S1 as its base. T3 results from the PN junction between the substrate and epi tub 110, and the nearby N-type region which is the collector of T4. T3 will be used for exemplary purposes to describe the operation of a specific embodiment of the invention. However, it will be understood that similar parasitic devices exist between the PN junction associated with epi tub 110 and any of the N-type diffusions in the integrated circuit which may operate in a similar manner.

As the N-type epi tub 110 associated with M1 is pulled below VNN, the PN junction between tub 110 and the substrate is forward biased and transistor T3 begins to conduct. However, because the collector of T3, i.e., epi tub 104, is electrically connected to the local substrate at S1, and because S1 is not tied to a fixed potential, the potential of the local substrate region is pulled negative, preventing T3 from conducting any appreciable current, and thereby inhibiting the injection of minority carriers into the substrate. According to a specific embodiment, the local substrate region at S1 can follow Vout down nearly as far as it goes, limited only by the breakdown voltage of barrier transistor T4.

When Vout goes positive and exceeds VPP, the body diode of M2 is turned on resulting in current flow through parasitic PNP transistor T2 and the injection of majority carriers into the substrate. Without barrier transistor T4, the potential of the substrate in this region, e.g., at S2, would attempt to rise correspondingly due to the fact that it has been allowed to float. However, because the base of T4 is tied to S2 and the emitter of T4 is tied to VNN, this effectively clamps the local substrate to one diode potential above VNN. This clamping at S2 reduces the risk that the injection of majority carriers via parasitic transistor T2 could cause a local potential increase which would result in the thyristor latch up effect. According to embodiments in which many such barrier regions surround the power transistors, the likelihood of latch up is correspondingly reduced.

It should be noted that, according to specific embodiments, certain design constraints may apply. For example, because of the fact that localized regions of the substrate are allowed to float and because not all injected minority carriers may be caught by the barrier regions, it may be desirable to avoid designs having diffusions exposed to the substrate in ways that would result in such devices being turned at unintended times or the injection of noise. For example, in integrated circuit 100, it is desirable to avoid the use of PNP devices in control circuitry 102 unless the base of such devices is tied to a low impedance point such as, for example, the positive supply rail. Similarly, it is desirable to avoid the use of PMOS devices where the body is connected to nodes other than the positive supply rail. In general, it may be desirable to tie all epi tubs to low impedance points. However, where it is undesirable to tie an epi tub directly to such a low impedance point, it may be tied to a potential above the most negative supply, e.g., 1 or more volts above the most negative supply.

Figure 2:
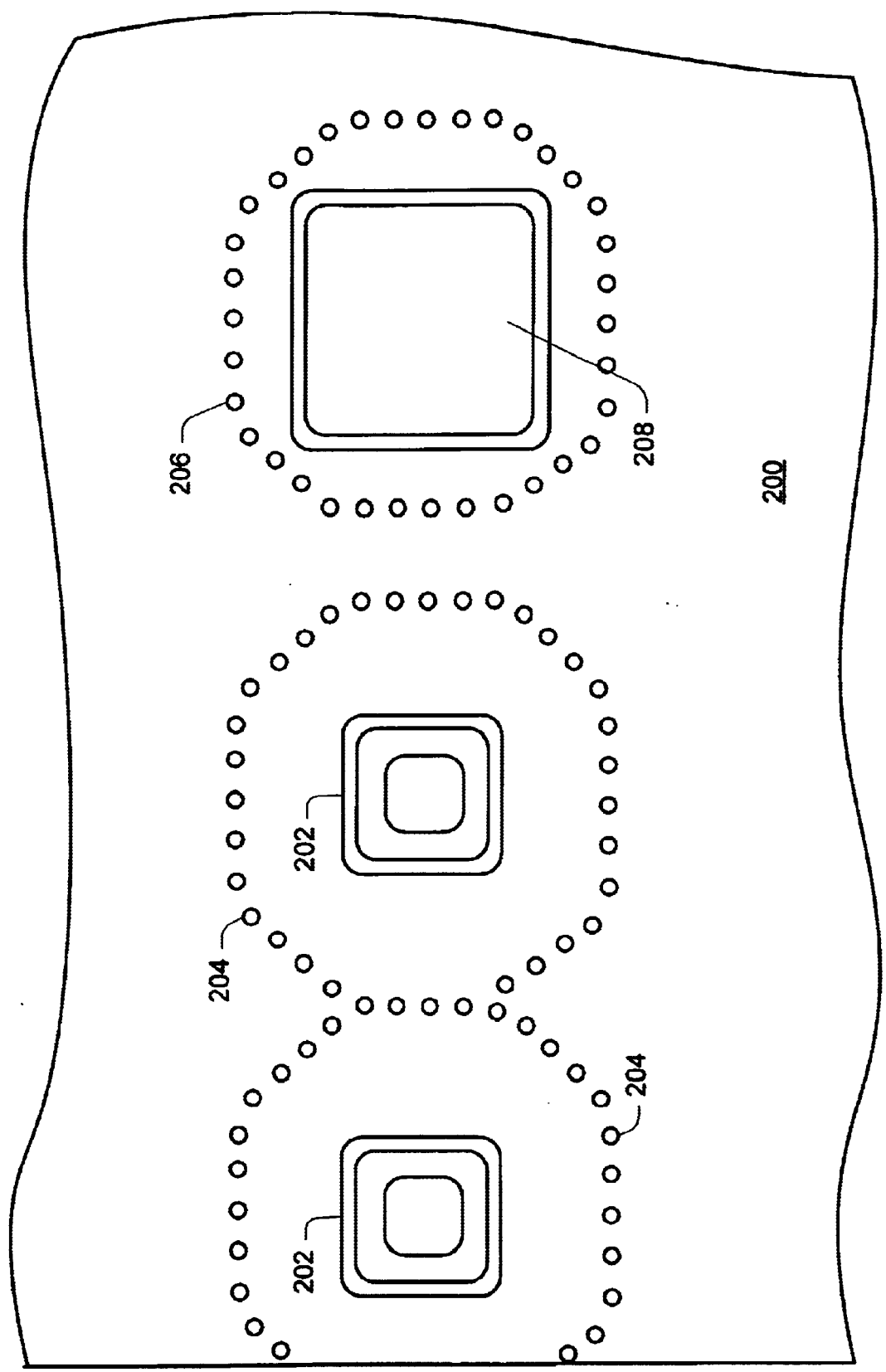
FIG. 2 is a simplified overhead view of devices in an integrated circuit die designed according to a specific embodiment of the present invention.

As mentioned above, and according to a specific embodiment illustrated in FIG. 2, each power transistor 202 in an integrated circuit 200 may be surrounded by a ring of barrier regions 204 like B1 and B2 to constrain the power transistor from turning on parasitic devices. In addition, additional barrier regions 206 may be associated with other circuitry 208 (and especially sensitive circuitry) on the device to further reduce the likelihood that any parasitic currents in the substrate will reach sensitive components. These barrier regions and their associated barrier transistors may also prevent latch up in situations where inputoutput pads (not shown) associated with circuitry 208 are forced above their normal operating potential as occurs, for example, during device testing. It should be noted that the scale and number of devices in FIG. 2 is shown merely for exemplary purposes and may be dramatically different for actual devices.

While the invention has been particularly shown and described with reference to specific embodiments thereof, it will be understood by those skilled in the art that changes in the form and details of the disclosed embodiments may be made without departing from the spirit or scope of the invention. For example, the circuits described herein may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., DMOS, CMOS, GaAs, SiGe, etc.), and device types suitable for designing and manufacturing the circuits described herein are within the scope of the invention.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. An integrated circuit, comprising:
   a substrate;
   a high-side power transistor in a first region of the substrate;
   a low-side power transistor in a second region of the substrate; and
   a plurality of barrier regions of the substrate adjacent and separating the first and second regions, each barrier region comprising a barrier transistor and at least one substrate connection connecting the barrier transistor to at least one floating region of the substrate adjacent the barrier region;
   wherein, during operation of the integrated circuit, the floating regions and the barrier transistors operate to inhibit operation of parasitic devices associated with the high-side and low-side power transistors.

2. The integrated circuit of claim 1 wherein the high-side and low-side transistors are configured in a half-bridge configuration.

3. The integrated circuit of claim 1 wherein the barrier transistor is a bipolar transistor, and the at least one substrate connection is between the collector of the barrier transistor and the at least one floating region.

4. The integrated circuit of claim 3 wherein the at least one substrate connection also includes the base of the barrier transistor.

5. The integrated circuit of claim 1 wherein the at least one substrate connection comprises a plurality of substrate connections between the barrier transistor and corresponding adjacent floating regions of the substrate.

6. The integrated circuit of claim 5 wherein the corresponding adjacent floating regions are spaced around each barrier region.

7. The integrated circuit of claim 1 wherein the substrate comprises a P-type semiconductor, the high-side power transistor and the low-side power transistor comprise N-channel field effect transistors, and the barrier transistor comprises a bipolar NPN transistor.

8. The integrated circuit of claim 1 further comprising additional circuitry in an additional region and additional barrier regions separating the additional circuitry from the power transistors.

9. The integrated circuit of claim 8 wherein the additional circuitry comprises drive circuitry for driving the power transistors.

10. The integrated circuit of claim 8 wherein the additional circuitry comprises input/output circuitry.

11. The integrated circuit of claim 2 wherein the half-bridge configuration of the power transistors comprises a switching stage of a digital switching amplifier.

12. The integrated circuit of claim 11 wherein the digital switching amplifier is a digital audio amplifier.

13. The integrated circuit of claim 1 wherein the floating regions and parasitic transistors between the barrier regions and the low-side power transistor operate to inhibit injection of minority carriers into the substrate when a potential associated with the low-side power transistor goes below a negative power supply voltage associated with the integrated circuit.

14. The integrated circuit of claim 1 wherein the floating regions and the barrier transistors operate to prevent latch up conditions when a potential associated with the high-side power transistor goes above a positive power supply voltage associated with the integrated circuit.

15. An electronic device comprising the integrated circuit of claim 1.

16. The electronic device of claim 15 wherein the electronic device comprises a digital switching amplifier.

17. At least one computer-readable medium having data structures stored therein representative of the integrated circuit of claim 1.

18. The at least one computer-readable medium of claim 17 wherein the data structures comprise a simulatable representation of the integrated circuit.

19. The at least one computer-readable medium of claim 18 wherein the simulatable representation comprises a netlist.

20. The at least one computer-readable medium of claim 17 wherein the data structures comprise a code description of the integrated circuit.

21. The at least one computer-readable medium of claim 20 wherein the code description corresponds to a hardware description language.

22. A set of semiconductor processing masks representative of at least a portion of the integrated circuit of claim 1.

23. An integrated circuit, comprising:
   a substrate;
   a power transistor in a first region of the substrate; and
   a plurality of barrier regions of the substrate around the first region, each barrier region comprising a barrier transistor and at least one substrate connection connecting the barrier transistor to at least one floating region of the substrate adjacent the barrier region;
   wherein, during operation of the integrated circuit, the floating regions and the barrier transistors operate to inhibit operation of parasitic devices associated with the power transistor.

24. The integrated circuit of claim 23 wherein the barrier transistor is a bipolar transistor, and the at least one substrate connection is between the collector of the barrier transistor and the at least one floating region.

25. The integrated circuit of claim 24 wherein the at least one substrate connection also includes the base of the barrier transistor.

26. The integrated circuit of claim 23 wherein the at least one substrate connection comprises a plurality of substrate connections between the barrier transistor and corresponding adjacent floating regions of the substrate.

27. The integrated circuit of claim 26 wherein the corresponding adjacent floating regions are spaced around each barrier region.

28. The integrated circuit of claim 23 wherein the substrate comprises a P-type semiconductor, the power transistor comprises an N-channel field effect transistor, and the barrier transistors comprise bipolar NPN transistors.

29. The integrated circuit of claim 23 further comprising additional circuitry in an additional region, the barrier regions separating the additional circuitry from the power transistor.

30. The integrated circuit of claim 29 wherein the additional circuitry comprises drive circuitry for driving the power transistor.

31. The integrated circuit of claim 29 wherein the additional circuitry comprises input/output circuitry.

32. The integrated circuit of claim 23 wherein the floating regions and parasitic transistors between the barrier regions and the power transistor operate to inhibit injection of minority carriers into the substrate when a potential associated with the power transistor goes below a negative power supply voltage associated with the integrated circuit.

33. The integrated circuit of claim 23 wherein the floating regions and the barrier transistors operate to prevent latch up conditions when a potential associated with the power transistor goes above a positive power supply voltage associated with the integrated circuit.

34. An electronic device comprising the integrated circuit of claim 23.

35. The electronic device of claim 34 wherein the electronic device comprises a digital switching amplifier.

36. At least one computer-readable medium having data structures stored therein representative of the integrated circuit of claim 23.

37. The at least one computer-readable medium of claim 36 wherein the data structures comprise a simulatable representation of the integrated circuit.

38. The at least one computer-readable medium of claim 37 wherein the simulatable representation comprises a netlist.

39. The at least one computer-readable medium of claim 36 wherein the data structure comprise a code description of the integrated circuit.

40. The at least one computer-readable medium of claim 39 wherein the code description correspond to a hardware description language.

41. A set of semiconductor processing masks representative of at least a portion of the interrogated circuit of claim 23.

* * * * *